(12) United States Patent
Huang et al.

(10) Patent No.: US 10,083,974 B1
(45) Date of Patent: Sep. 25, 2018

(54) FLOATING MEMRISTOR

(71) Applicant: BEIHANG UNIVERSITY, Beijing (CN)

(72) Inventors: Anping Huang, Beijing (CN); Xinjiang Zhang, Beijing (CN)

(73) Assignee: BEIHANG UNIVERSITY, Beijing (CN)

(*) Notice: Subject to any disclaimer, the term of this patent is extended or adjusted under 35 U.S.C. 154(b) by 0 days.

(21) Appl. No.: 15/674,206

(22) Filed: Aug. 10, 2017

(30) Foreign Application Priority Data

Mar. 23, 2017 (CN) .......................... 2017 1 0177991

(51) Int. Cl.
G11C 16/00 (2006.01)
H01L 27/11521 (2017.01)
G11C 16/04 (2006.01)
H01L 27/1156 (2017.01)
G06N 3/02 (2006.01)
H01L 29/788 (2006.01)
H01L 29/78 (2006.01)
H01L 29/423 (2006.01)
H01L 27/108 (2006.01)

(52) U.S. Cl.
CPC .......... H01L 27/11521 (2013.01); G06N 3/02 (2013.01); G11C 16/0408 (2013.01); H01L 27/10802 (2013.01); H01L 27/1156 (2013.01); H01L 29/42324 (2013.01); H01L 29/788 (2013.01); H01L 29/7841 (2013.01)

(58) Field of Classification Search
CPC . G11C 16/0408; G06N 3/02; H01L 27/11521; H01L 27/10802; H01L 27/1156; H01L 29/42304; H01L 29/7481; H01L 29/788
USPC .................. 365/185.28, 185.05; 716/30, 100
See application file for complete search history.

(56) References Cited

U.S. PATENT DOCUMENTS 8,001,491 B2 * 8/2011 Kao .................... H01L 51/0529
257/40
8,586,961 B2 * 11/2013 Pop ........................ B82Y 10/00
257/5

* cited by examiner

Primary Examiner — Tan T. Nguyen
(74) Attorney, Agent, or Firm — Treasure IP Group, LLC

(57) ABSTRACT

A floating memristor with a nano-battery between a top and bottom floating gates is disclosed. The floating memristor includes a nano-battery, a top floating gate assembly disposed on an anode of the nano-battery, and a bottom floating gate assembly disposed on a cathode of the nano-battery. The floating memristor is an artificial synapse. The top floating gate assembly and the anode of the nano-battery convert electric signal to ionic signal by tunneling effect and field effect to simulate a presynaptic membrane. The electrolyte of the nano-battery is an ionic channel as a synaptic gap. The anode and the bottom floating gate transfer the ionic signal to electric signal by field effect and tunneling effect to simulate a postsynaptic membrane.

16 Claims, 8 Drawing Sheets

FLOATING MEMRISTOR

CROSS REFERENCE TO RELATED APPLICATION

This application takes priority from a prior filed Chinese application CN 201710177991.4 entitled "FLOATING MEMRISTOR," on Mar. 23, 2017, which the Chinese application are hereby incorporated by reference in its entirety.

TECHNICAL FIELD

The present invention relates to a nanoscale floating gate memristor, which belongs to the general field of on memristors in neural morphological calculations and, more particularly, to an ion type synaptic memory based memristor formed by nanowires and transistor floating gates.

BACKGROUND

Significant research and development efforts are currently directed toward designing and implementing artificial synapses for neural network based learning systems, such as memristors and synaptic transistors. The memristor is a two-terminal passive device with a variable internal resistance. This resistance depends on the amount of charge which passed through the memristor by a bias applied before. As soon as the desired internal resistance is adjusted, this biasing is interrupted. The memristor will thus maintain exactly this internal resistance until the next biasing is applied. Recently, the memristor was discussed in literature in connection with synapses and neuro-morphological systems.

Memristors made of various materials and structures have been researched. Synaptic transistors made of nano batteries have also archived quite impressive results. However, the performance of these synaptic devices are not sufficient for practical neuromorphic computing. For example, memristors with metal-insulator-metal structures have unstable, uncontrollable, read/write noise resistive behaviors. Synaptic transistors decouple the electron and ion to reduce the read/write noise and have presented improved results, but the transistor structures have a scaling up problem since there are approximately $1.5 \times 10^{14}$ synapses, connecting 19-23 billion neurons in human brain.

Synaptic plasticity, an ability for synapses to strengthen or weaken, is a fundamental mechanism how synapses learn and adapt over time. A synaptic device is an electronic switch which can simulate a biological synapse in both function and structure, and a synaptic device is essential for neuromorphic computing, including brain-like computing and brain-inspired computing. In biology, a synapse is used to convert electric signals to chemical signals in pre-synapses and reverse chemical signals into electric signals by post-synapses. Synapses have two terminal structures that permits a neuron to pass an electrical or chemical signal to another neuron. Nanobatteries can regulate the ionic concentration in anodes and cathodes by an external electric field through electrochemical reactions. However, to read out the conductance of the nanobattery in a two-terminal device is a formidable challenge because the electrolyte of the nanobattery is made of highly electrical resistive materials. To achieve a synaptic memristor, a suitable physical effect and novel structure are needed.

BRIEF DESCRIPTION OF THE DRAWINGS

The detailed description will make reference to the following drawings, by way of example. For the sake of brevity, reference numerals having a previously described function may or may not be described in connection with the drawing in which they appear.

DETAILED DESCRIPTION

Reference is now made in detail to specific examples of the disclosed floating memristor. A floating memristor can simulate biological synapses and can be used in the field of neuromorphic computing and brain-like computing.

In the following detailed description, reference is made to the drawings accompanying this disclosure, which illustrate specific examples in which this disclosure may be practiced. It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Memristors are nonvolatile two-terminal nano scale solid state resistive switching devices, which can be used as a component in a wide range of electronic circuits, especially synaptic devices in neuromorphic computing, including brain-like computing and brain-inspired computing. When used as a synaptic device, throughout last few years, researchers have made great progress to improve the performance of the synaptic devices, including two-terminal memristors and three-terminal transistors. This invention discloses a floating memristor, which can model biological synapses, and can be used as a basic device in neuromorphic computing systems. Example embodiments are described with reference to FIGS. 1-6C.

The detailed description is organized as the following. A description of a floating memristor device is demonstrated in the first subsection. Different sizes and various materials of a floating memristor are provided. A description of floating memristor crossbars are provided in the second subsection. A floating memristor crossbar based neural network is described in the third subsection. An implemented example of a floating memristor is provided in the last subsection.

The Floating Memristor Device

Figure 1:
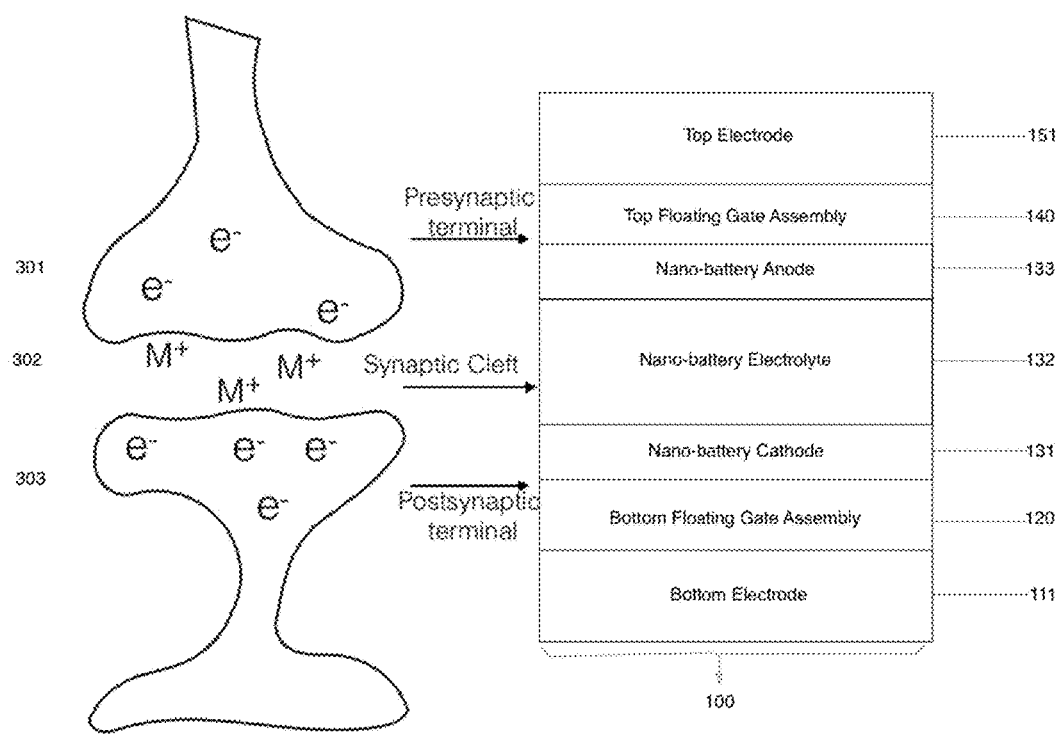
FIG. 1 shows the schematic technical illustration of a floating memristor analog to a biological synapse.

Referring to FIG. 1, the schematic perspective view a floating memristor 100 analog to a biological synapse 300 is illustrated.

Figure 2A:
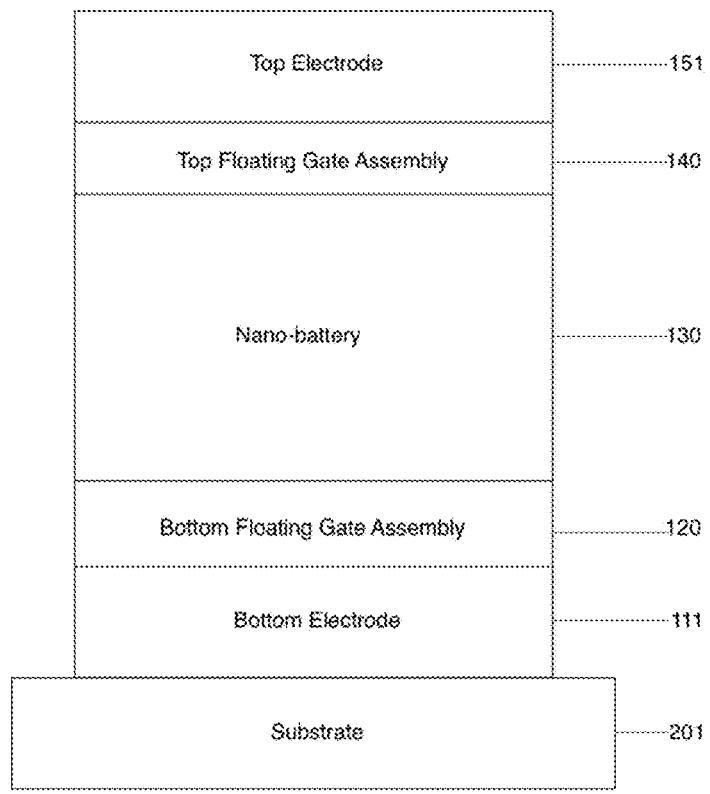
FIGS. 2A and 2B shows schematic illustration of a floating memristor and an example embodiment floating memristor.
Figure 2B:
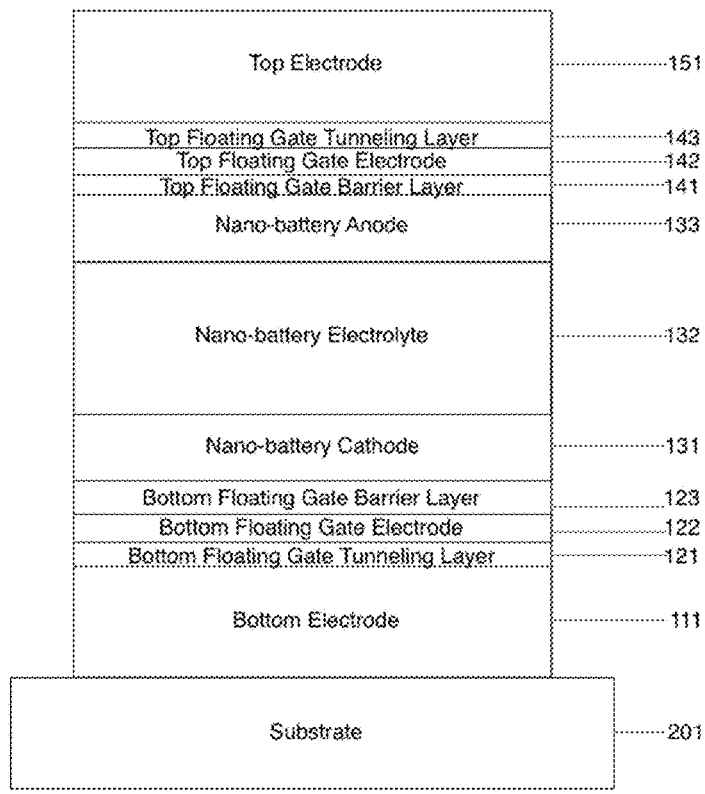

Referring to FIG. 2A, the basic structure of a floating memristor 100 comprises a nanobattery 130 between a top floating gate assembly 140 and a bottom floating gate assembly 120. FIG. 2B shows an embodiment of a floating memristor device 100, including top electrode 151, top floating gate tunneling layer 143, top floating gate electrode 142, top floating gate barrier layer 141, nano-battery anode 133, nano-battery electrolyte 132, nano-battery cathode 131, bottom floating gate barrier layer 123, bottom floating gate electrode 122, bottom floating gate tunneling layer 121, and bottom electrode 111. In other embodiments, the nano-battery cathode 131 and the nano-battery anode 133 can exchange. The thickness of nano-battery electrolyte 132 can also be zero. Wherein, the top electrode 151, the top floating gate tunneling layer 143, the top floating gate electrode 142, the top floating gate barrier layer 141 and the nano-battery anode 133 are used to simulate the presynaptic membrane 301. Electron tunneling effects and electric field effect are used to convert electronic signals into ionic signals. The nano-battery electrolyte 132 is used as an ion channel to simulate the synaptic cleft 302. The nano-battery cathode 131, bottom floating gate barrier layer 123, bottom floating gate electrode 122, bottom floating gate tunneling layer 121, and bottom electrode 111 are used to simulate the post synaptic membrane 301, which convert an ionic signal into an electronic signal. A floating memristor simulates a synapse 300, in which, the ion migration history of nano-battery 130 which records as the number of electrons stored in the top floating gate electrode 142 and bottom floating gate electrode 122 represents the synaptic connectivity strength, in term of synaptic weights.

A floating memristor 100 according to the present invention utilizes the electrochemical reaction in the nano-battery 130 to migrate the alkali metal or alkaline earth metal ions at the nano-battery anode 133 and nano-battery cathode 131. Floating gate assemblies 120 and 140 borrowed from the transistor causes alkali or alkaline earth metal ions of the nano-battery migrate by field effect; write and read the ion migration history of nano-battery through electron tunneling mechanism.

A floating memristor 100 utilizes ions in the nano-battery 130 and electrons in the floating gate assemblies 122 and 142 both for write and read operations. During a write operation for changing the state of floating memristor 100, a voltage or current spike is applied on the top and bottom electrodes 151 and 111 to charge or discharge the nano-battery 130 by a tunneling effect and a field effect. After a voltage or current is applied on the electrodes 151 and 111, electrons tunnel from top electrode 151 to the top floating gate electrode 142, or escape from bottom floating gate electrode 122 to the bottom electrode 111, and the ion distribution in nano-battery 130 will change because of electrochemical reaction. In a read operation, the mechanism is the same as that in the write operation, while the difference is that the read signal is smaller to promise the state of the floating memristor 100 unconverted. By using electrons and ions both for read and write operations, the floating memristor 100 simulates a biological synapse 300.

Referring to FIG. 2B, the detailed description of components in this embodiment is described as following:

A floating memristor 100, comprises the top and bottom electrodes 151 and 111, each having a thickness of 20 nm to 40 nm, being made of an inert electrode such as platinum (Pt) or gold (Au). The top and bottom electrodes 151 and 111 are used to connect to an external power source.

Figure 3:
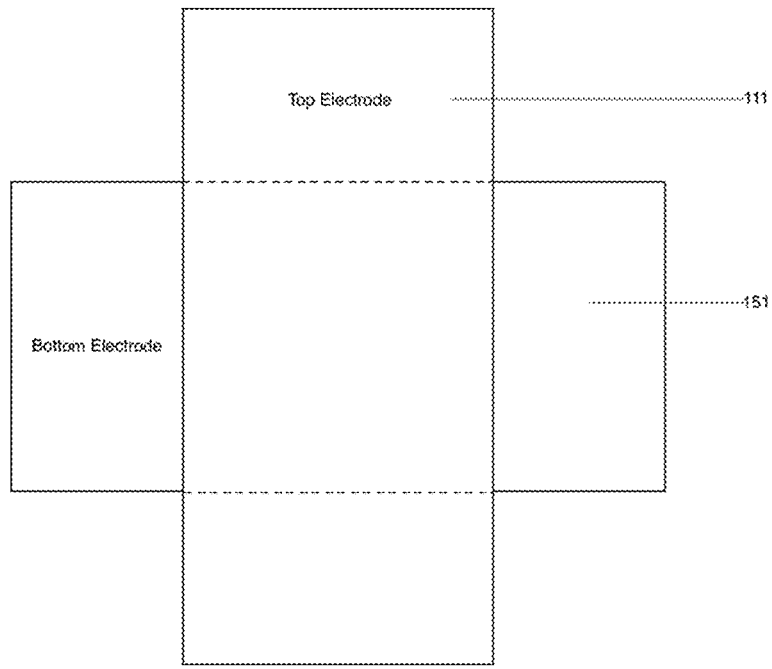
FIG. 3 shows a top plan-view of a floating memristor with a top electrode cross with a bottom electrode in accordance with embodiments of the present invention.

In the floating memristor 100 as described herein, the top and bottom electrodes 151 and 111 have a width of 5 nm to a few mm as shown in FIG. 3, and top electrode 151 can be oriented asymmetrically along its width direction with the bottom electrode 111.

In the floating memristor 100 as described herein, the top and bottom floating gate layers 140 and 120 are used to store electrons tunneling from the top and bottom electrodes 151 and 111, and also provide an electric field to induce migration of alkali or alkaline earth metal ions in the nano-battery 130. The top and bottom floating gate electrodes 142 and 122 have a thickness from 2 nm to ~100 nm, respectively. And the materials made into the top and bottom floating gate electrodes 142 and 122 include inert metals, metal nitrides or doped semiconductors, such as platinum (Pt), gold (Au), doped polysilicon (Si), tantalum nitride (TaN), and the like.

In the floating memristor 100 as described herein, the top floating gate and bottom floating gate electron tunneling layers 143 and 121 are used to transport electrons from the top and bottom electrode 151 and 111 to the top floating gate electrode 142 and bottom floating gate electrode 122, so that an electronic field is formed between the nano-battery anode 133 and the nano-battery cathode 131. The bottom electrode 111 and the bottom floating gate electrode 121 produce tunneling current through the electric field effect tunneling. The top floating gate tunneling layer 143 and bottom floating gate tunneling layer 121 have a thickness of 2 nm to 8 nm. Further, both top floating gate tunneling layer 143 and bottom floating gate tunneling layer 121 can be placed in the device structure in a symmetry or asymmetry fashion.

In the floating memristor 100 as described herein, the top floating gate barrier layer 141 and bottom floating gate barrier layer 123 are used to stop electrons transport between the nano-battery 130 and the top floating gate electrode 142 and bottom floating gate electrode 122 to achieve a non-volatile memory, and these two layers also can be placed asymmetric to each other in the device structure with respect to materials and size. The thickness of the top floating gate barrier layer 141 and bottom floating gate barrier layer 123 can vary from 6 nm to 12 nm.

The top floating gate barrier layer 141, the bottom floating gate barrier layer 123, the top floating gate tunneling layer 143, and the bottom floating gate tunneling layer 121 may be formed of dielectric materials including various high-K media such as titanium dioxide ($TiO_2$), silicon nitride ($Si_3N_4$), hafnium oxide ($HfO_2$), tantalum pentoxide ($Ta_2O_5$), zirconium oxide ($ZrO_2$), alumina $Al_2O_3$), silica ($SiO_2$), and the like.

In the floating memristor 100 as described herein, the nanobattery anode 133 is a temporary storage region for an alkali metal or alkaline earth metal ion, and the nanobattery anode 133 has a thickness of ~3 nm to ~100 nm, and the materials of the nanobattery anode 133 include an alkali metal element compound, an alkaline earth metal element compound or a semiconductor oxide such as lithium titanate ($Li_4Ti_5O_{12}$), polycrystalline silicon (Si), titanium oxide ($TiO_2$), and vanadium oxide ($V_2O_5$).

In the floating memristor 100 as described herein, the nano-battery electrolyte 132 is used as a transport channel of an alkali metal or alkaline earth metal ion where ions are easily passed and electrons are difficult to pass. The nano-battery electrolyte 132 has a thickness of 0 nm to ~100 nm and the nano-battery electrolyte 132 can be mad of materials includes an alkali metal or alkaline earth metal compound such as lithium phosphorus (LiPON), lithium tantalate ($LiTaO_3$), lithium niobate ($LiNiO_3$), etc.

A floating memristor 100, wherein the nano-battery cathode 131 is an alkali metal or an alkaline earth metal ion source and is driven by an electrochemical reaction under the induction of the electric field between top floating gate electrode 142 and bottom floating gate electrode 122 such that ions migrate to the nano-battery anode 133. The nano-battery cathode 131 has a thickness of 10 nm to ~100 nm, and the material includes alkali metal or alkaline earth metal element compounds such as lithium cobalt oxide $LiCoO_2$, lithium nickelate ($LiNiO_2$), lithium manganate ($LiMn_2O_4$), lithium iron phosphate ($LiFePO_4$), and the like.

In order to provide a more detail description of the mechanism and operation of a floating memristor, FIG. 2B is explained further. The ion transport history of the nano-battery 130 is recorded by electrons in the top floating gate electrode 142 and bottom floating gate electrode 122. The top floating gate electrode 142 and bottom floating gate electrode 122 connect with the top electrode 151 and the bottom electrode 111 through the top floating gate tunneling layer 143 and the bottom floating gate tunneling layer 121 to achieve electron transport, while the top bottom floating gate barrier layer 123 and the top floating gate barrier layer 141 help the bottom floating gate electrode 122 and top floating gate electrode 142 maintain an electrical field to drive the electrochemical reaction of the ion transport.

The electrons from the top electrode 151 tunnel into the top floating gate electrode 142, makes the nano-battery anode 133 charged, specifically, the nano-battery anode 133 needs additional cations to neutralize the top floating gate electrode electron field, therefore, the cations are induced from the nano-battery cathode 131 to the nano-battery anode 133, and the electrons in the bottom floating gate electrode 122 tunnel into the bottom electrode 111 due to the discharge of the nano-battery cathode 131.

During the write operation, a positive voltage pulse is applied to the top electrode 151 that electrons tunnel into the top floating gate electrode 142 to redistribute the alkali metal ion or alkaline earth metal ion in the nano-battery 130, and the activation is performed if the bottom electrode can output tunneling current. The concentration of the alkali metal ion or alkaline earth metal ion in the nano-battery cathode 131 and nano-battery anode 133, and the concentration of the electrons in the bottom floating gate electrode 122 and top floating gate electrode 142 will change each time the activation is completed. Those concentrations of the floating memristor 100 are recorded as one state, then, with the increase in the number of activation, the device will become more and more easily activated, if the reverse voltage applied to the top electrode 151, it will inhibit the next electrode after the tunneling current, this mechanism is a simulation of the synaptic plasticity.

Floating Memristor Crossbar

The invention utilizes the electrochemical reaction of the nano-battery 130 and the tunneling effect of the floating gate assemblies 120 and 140 to decouple the electron and ion, eliminating the influence of electron and ion coupling on the read and write process of the memristor, and improves the controllability of the memristor.

The invention combines the nano-battery 130 and two transistor floating gate assemblies 120 and 140 to simulate synaptic plasticity, and the mechanism is more close to the biological synapses 300, which can effectively promote a neural network based learning system.

Figure 4A:
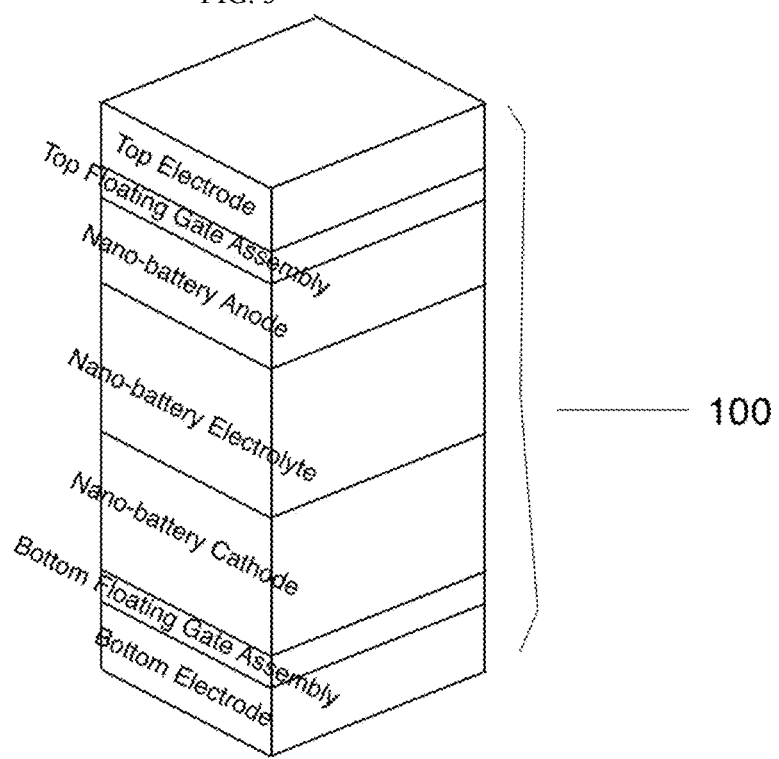
FIGS. 4A, 4B and 4C show an isometric view of a floating memristor crossbar configured in accordance with embodiments of the present invention.
Figure 4B:
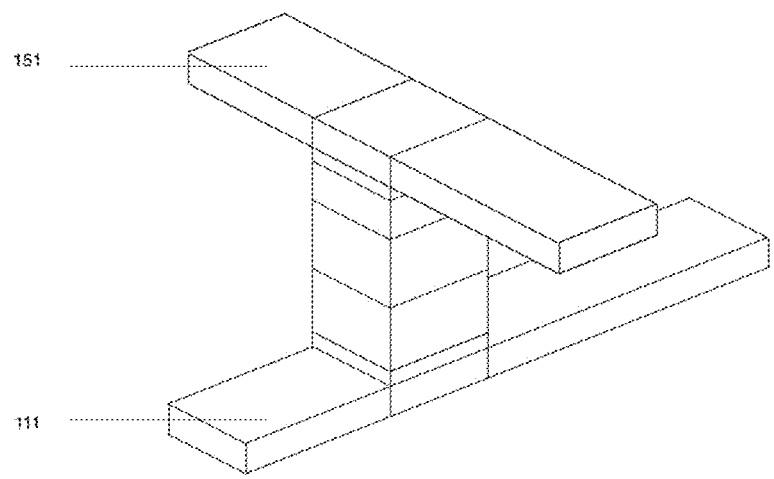
Figure 4C:
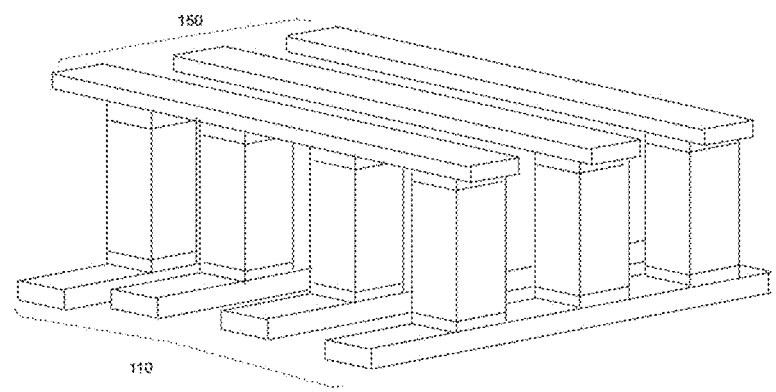

Referring to FIGS. 4A, 4B and 4C, the floating memristor described above can be implemented at nanowire intersection of a nanowire crossbar. The top electrode assembly 150 and bottom electrode assembly 110 can form the nanowire of a crossbar, as shown in FIG. 4B, and this crossbar is compatible with CMOS technology. This crossbar is composed of a first layer of conductive nanowires as the top electrode assembly 150, a second layer of conductive nanowires as the bottom electrode assembly 110, and each cross point of the crossbar is a floating memristor 100. In a floating memristor crossbar as shown in FIG. 4C, within the top electrode assembly 150, each individual nanowire of the first layer nanowires is placed substantially parallel to each other, and within the bottom electrode assembly 110, each individual nanowire of the second layer nanowires is placed substantially parallel to each other as well.

The nano-battery in the invention has been widely used in the battery industry, and the semiconductor floating gate technology has been widely used in flash memory technology, which is beneficial to the large-scale production and industrial application of floating gate memristors.

Neural Network Using Floating Memristor Crossbar

Figure 5A:
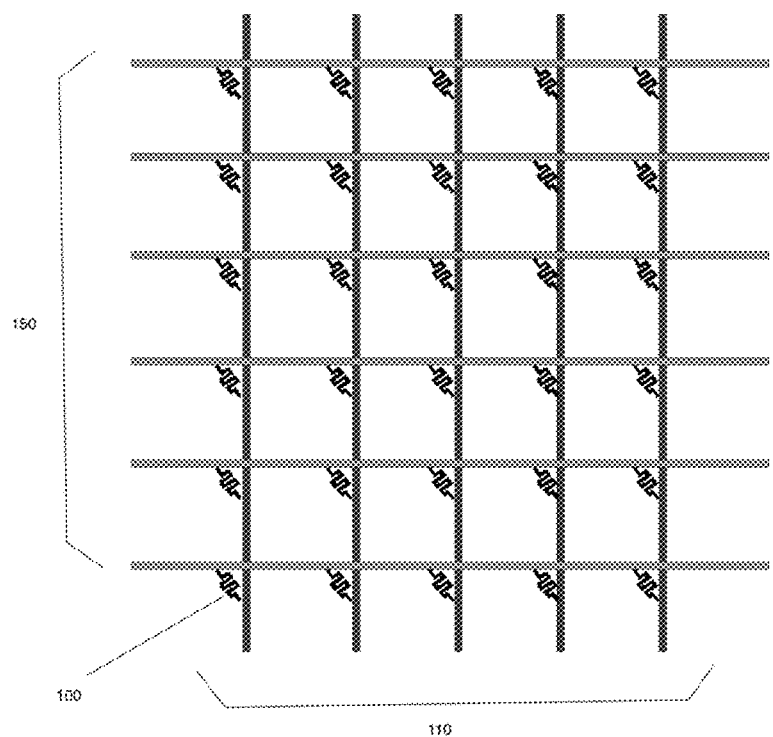
FIGS. 5A and 5B show a floating memristor crossbar based neural network, where each cross junction is a floating memristor to simulate a plastic synapse.
Figure 5B:
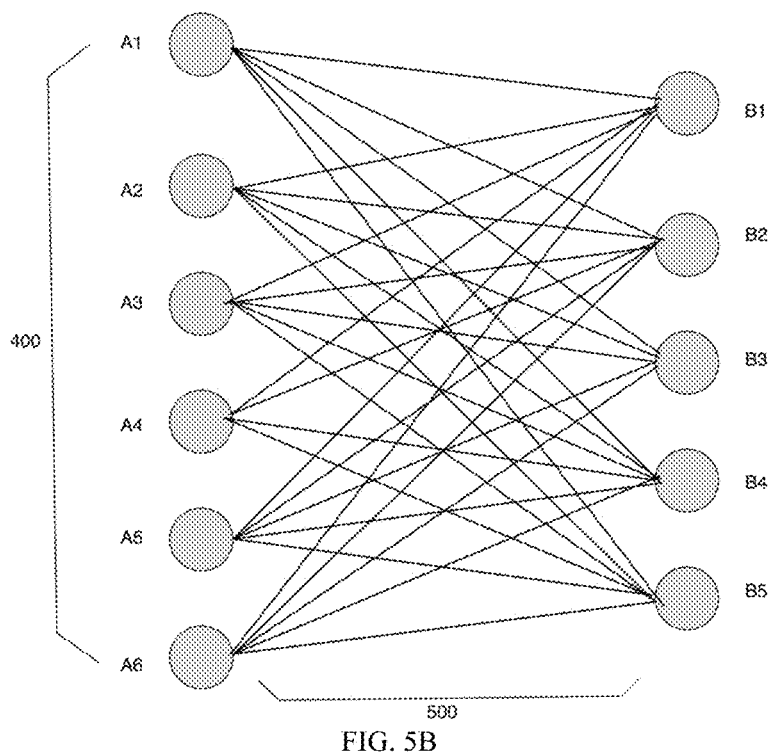

Referring to FIGS. 5A and 5B, a floating memristor crossbar can implement a neural network, wherein, each floating memristor in the memristor crossbar represents a synapse between neurons. As show in FIGS. 5A and 5B, a 6×5 crossbar can implement a neural network with 6 input neurons and 5 output neurons. Each cross-point of the crossbar corresponds to a synapse between neurons of the input layer and output layer.

Fabrication of Floating Memristors

Figure 6A:
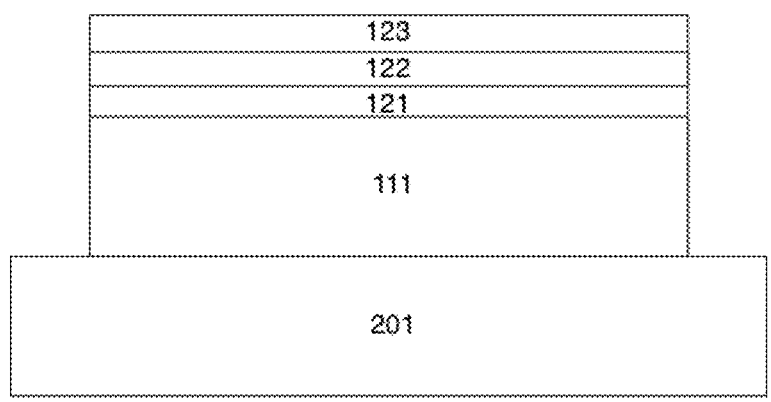
FIGS. 6A, 6B and 6C show a cross-sectional views of device structures formed at a process stage to illustrate process flows of forming an example embodiment floating memristor.
Figure 6B:
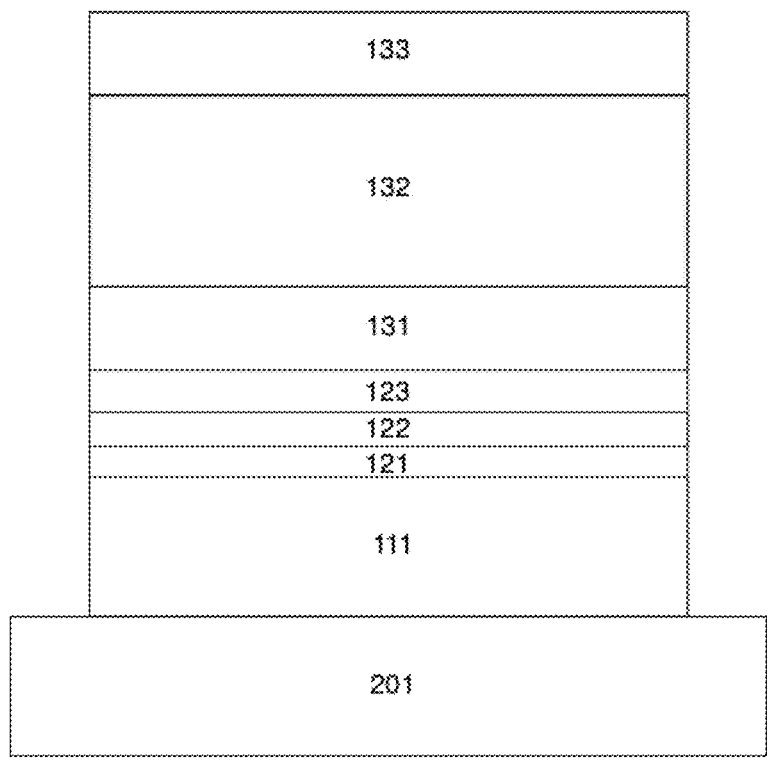
Figure 6C:
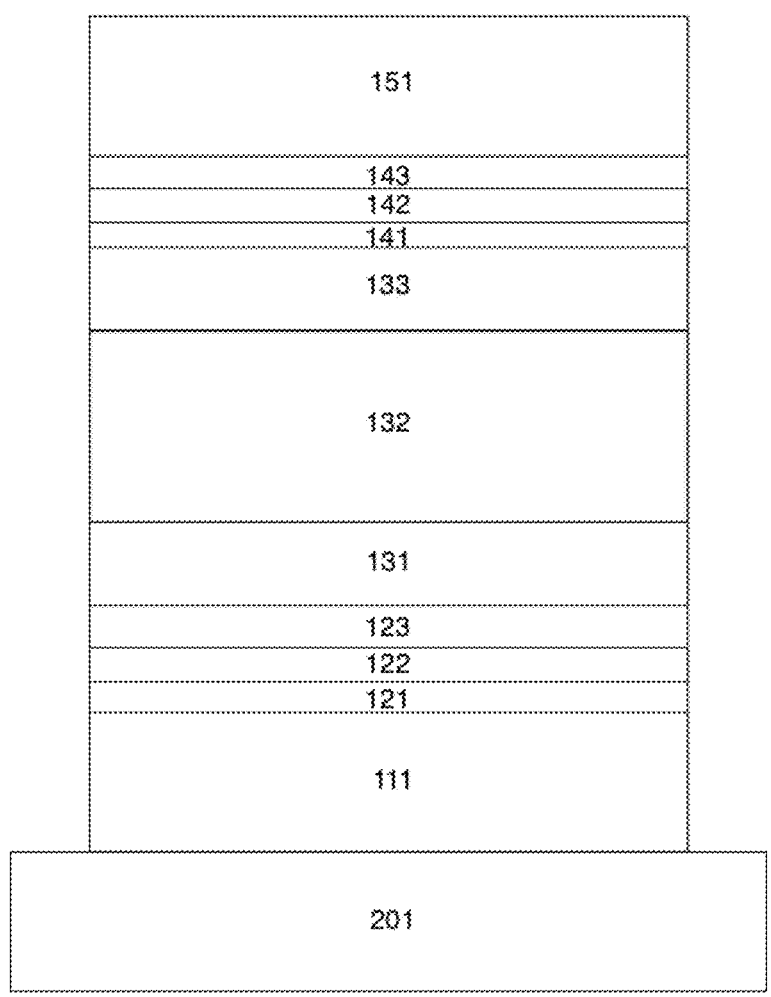

Referring to FIGS. 6A, 6B and 6C, the composition of the present invention will now be described in further detail with reference to the accompanying drawings, which are intended to facilitate the understanding of the invention, and specific structural details and functional details thereof are merely illustrative of the purpose of describing exemplary embodiments without any limitation. Accordingly, the invention may be practiced in many alternative forms and the invention should not be construed as being limited to the exemplary embodiments set forth herein, but rather encompasses all changes, equivalents, and equivalents which fall within the scope of the invention.

As shown in FIG. 2B, a floating gate memristor structure according to the present embodiment is an ion type synaptic memory based on a nano-battery with top and bottom floating gates. The basic structure of the device includes a bottom electrode assembly 110, a bottom floating gate assembly 120, a nano-battery 130, a top floating gate assembly 140, and a top electrode assembly 150. The bottom electrode assembly 110 is made of 30 nanometers of Pt. The bottom floating gate tunneling layer 121 is made of $Al_2O_3$ with a thickness of 4 nm. The bottom floating gate barrier layer 123 is made of $Al_2O_3$ with a thickness of 10 nm. The bottom floating gate electrode 122 uses 6 nm of TaN. The nano-battery cathode 131 is 20 nm of $LiCoO_2$. The nano-battery electrolyte 132 uses 20 nm LiPON. The nano-battery anode 133 is 10 nm of $Li_4Ti_5O_{12}$. The top floating gate barrier layer 141 is $Al_2O_3$, having a thickness of 8 nm. The top floating gate tunneling layer is $Al_2O_3$ at 3 nm. The top floating gate electrode 142 employs 5 nm of TaN. The top electrode assembly 150 employs 30 nm of platinum.

Experimental devices are fabricated by using pulsed laser deposition (PLD) technique, ultrahigh vacuum magnetron sputtering with multiple semiconductor lithography process or the like in combination, prepared from the bottom up layer by layer on a substrate. First, on the flat substrate 201, a layer of Pt is prepared by magnetron sputtering as the bottom electrode assembly 110, and then an $Al_2O_3$ film is deposited on the upper surface of the bottom electrode 110 as a bottom floating gate tunneling layer 121 by PLD. The electron tunneling layer, a layer of TaN is prepared by magnetron sputtering and the floating gate electrode 122 is prepared by photolithography and wet etching, and then an $Al_2O_3$ film is deposited on the floating gate electrode 122 as a bottom floating gate barrier layer 123 using PLD. The bottom floating gate assembly 120 is complete as shown in FIG. 6A. A $LiCoO_2$ thin film is prepared on the bottom floating gate barrier layer 123 as a nano-battery cathode 131. A layer of LiPON film is prepared by PLD on the nano-battery cathode 131 as a nano-battery electrolyte 132. A layer of $Li_4Ti_5O_{12}$ is prepared as a nano-battery anode 133 by PLD on the nano-battery electrolyte 132. The nano-battery layer 130 is complete as shown in FIG. 6B. A thin film of Al2O3 is prepared by PLD on the nano-battery anode 133 as a top barrier layer. The top floating gate electrode 142 is formed by depositing a layer of TaN by magnetron sputtering, followed by wet etching and photolithography. Then a film of $Al_2O_3$ is deposited on the floating gate electrode 142 as the top floating gate tunneling layer 143. After that, the top floating gate assembly 140 is completed. Finally, a layer of Pt as the top electrode assembly 150 is formed on the top floating gate tunneling layer 143 by magnetron sputtering.

During the write operation, a positive voltage pulse is applied to the top electrode 151 such that electron tunneling into the top floating gate electrode 142, and the Li ion in the nano-battery 130 is induced by the field effect of the top floating gate electrode 142 from $LiCoO_2$ to $Li_4Ti_5O_{12}$, redistributing the Li ion in nano-battery. The surplus electrons in the $LiCoO_2$ allow the electrons to enter the bottom electrode assembly 110 from the bottom floating gate electrode 122 by field effect, such that the bottom electrode assembly 110 outputs current to complete the activation. The concentration of Li ions in the nano-battery anode and nano-battery cathode 133 and 131, and the electron concentration in the top and bottom floating gate electrodes 122 and 142 are changed whenever activations complete, and each ion and electron concentration distribution is recorded as a state. With the increase in the number of activations, the device will become more and more easily activated. To inhibit the device, a negative voltage pulse will be applied to the top electrode 151 to discharge the top floating gate electrode.

The Elements in the embodiments are:
151 top electrode
140 top floating gate assembly
141 top floating gate barrier layer
142 top floating gate electrode
143 top floating gate tunneling layer
133 nano-battery anode
132 nano-battery electrolyte
131 nano-battery cathode
130 nano-battery
120 bottom floating gate assembly
123 bottom floating gate barrier layer
122 bottom floating gate electrode
121 bottom floating gate tunneling layer
111 bottom electrode
150 top electrode assembly (150 is top electrode of crossbar, while 151 is top electrode of a device, and 110 is the same, as shown in FIG. 4C)
110 bottom electrode assembly
100 floating memristor embodiment (a device embodiment made of elements 111, 120, 130, 140, and 151, as shown in FIG. 4A.)
400 neurons in a neural network (as shown in FIG. 4A)
500 synapses in a neural network (synapses in a neural network, as shown in FIG. 4A)
201 substrate
301 presynaptic membrane
302 synaptic cleft
303 postsynaptic membrane

What is claimed is:

1. A floating memristor, including:
   a bottom electrode;
   a top electrode; and
   a bottom floating gate assembly, formed on the bottom electrode, including a bottom floating gate tunneling layer, a bottom floating gate electrode, and a bottom floating gate barrier layer, from bottom to top; and
   a nano-battery, formed on a bottom floating gate, composed of a nano-battery anode, a nano-battery electrolyte, and a nano-battery cathode; and
   a top floating gate assembly, formed on the nano-battery and contacting with the top electrode, including a top floating gate barrier layer, a top floating gate electrode, and a top floating gate tunneling layer from bottom to top;
   wherein
   the top electrode, the top floating gate assembly and the nano-battery anode can convert an electric signal to an ion signal by tunneling effect and field effect to simulate a presynaptic membrane;
   the nano-battery electrolyte is used as an ion channel to simulate a synaptic cleft;
   the nano-battery cathode, the bottom floating gate, and the bottom-electrode are configured to simulate the postsynaptic membrane, transforming the ion signal into the electronic signal.

2. The floating memristor of claim 1, wherein the top electrode and bottom electrode are connected to an external power source and the top electrode and bottom electrode have a thickness from 10 nm to 100 nm.

3. The floating memristor of claim 1, wherein the top floating gate electrode and bottom floating gate electrode have thickness within a range of about 3 nm to 100 nm.

4. The floating memristor of claim 1, wherein the top floating gate tunneling layer and bottom floating gate tunneling layers have a thickness from 2 nm to 8 nm.

5. The floating memristor of claim 1, wherein the top floating gate barrier layer and bottom floating gate barrier layer having a thickness from 6 nm to 12 nm.

6. The floating memristor of claim 1, wherein
   the nano-battery has an nano-battery anode having a thickness at 4 nm to 100 nm;
   the nano-battery electrolyte has a thickness of about 0 nm to 100 nm; and
   the nano-battery has a nano-battery cathode thickness of about 10 nm to 100 nm.

7. The floating memristor of claim 1, wherein a width of the top electrode and bottom electrode are more than 5 nm.

8. The floating memristor of claim 1, wherein the top electrode and bottom electrode are of inert electrode, including platinum (Pt) and gold (Au).

9. The floating memristor of claim 1, wherein the top floating gate electrode and the bottom floating gate electrode are made of a material selected from an inert metal, a metal nitride and a doped semiconductor, including platinum (Pt), Gold (Au), doped polysilicon (Si), and tantalum nitride (TaN).

10. The floating memristor of claim 1, wherein the bottom floating gate tunneling layer, the bottom floating gate barrier layer, the top floating gate tunneling layer, the bottom floating gate barrier layer, are made of dielectric materials, including titanium oxide ($TiO_2$), silicon nitride ($Si_3N_4$), hafnium dioxide ($HfO_2$), pentahydrate ($Ta_2O_5$), Tantalum ($Ta_2O_5$), zirconium oxide ($ZrO_2$), alumina ($Al_2O_3$), and silica ($SiO_2$).

11. The floating memristor of claim 1, wherein the nano-battery anode is made of an alkali metal element compound, an alkaline earth metal element compound or a semiconductor oxide, including lithium titanate ($Li_4Ti_5O_{12}$), polycrystalline silicon (Si), titanium oxide ($TiO_2$), and vanadium oxide ($V_2O_5$).

12. The floating memristor of claim 1, wherein the nano-battery electrolyte is an alkali metal or alkaline earth metal compound, including but not limited to, lithium phosphoxine (LiPON), lithium tantalate $LiTaO_3$), and lithium niobate ($LiNiO_3$).

13. The floating memristor of claim 1, wherein the material of the nano-battery cathode is an alkali metal or alkaline earth metal element compound, including lithium cobalt oxide ($LiCoO_2$), lithium nickelate $LiNiO_2$), lithium manganate ($LiMn_2O_4$), lithium iron phosphate ($LiFePO_4$).

14. A floating memristor crossbar comprising:
a first layer of conductive nanowires arranged substantially parallel to each other in a first direction;
a second layer of conductive nanowire arranged substantially parallel to each other in a second direction, each nanowire in the second layer forming a crossbar junction with each nanowire in the first layer, wherein each crossbar junction includes a top floating gate assembly, a nano-battery and a bottom floating gate assembly from top to bottom in that order, wherein
the bottom floating gate assembly, formed on the first nanowire, including a bottom floating gate tunneling layer, a bottom floating gate electrode, and a bottom floating gate barrier layer from bottom to top in that order; and
a nano-battery stacks on the bottom floating gate assembly, composed of a nano-battery anode, a nano-battery electrolyte, and a nano-battery cathode; and
a top floating gate assembly, formed on the nano-battery, contacts with the second nanowire, including a top floating gate barrier layer, a top floating gate electrode, and a top floating gate tunneling layer from bottom to top in that order;
wherein the top electrode, the top floating gate assembly and the nano-battery anode are configured to convert an electronic signal into an ion signal and the reverse process through electron tunneling effect and field effect, to simulate a presynaptic membrane;
the nano-battery electrolyte configured to be an ion channel to simulate the synaptic cleft;
the nano-battery cathode, the bottom floating gate assembly, and the bottom-electrode assembly, configured to simulate the postsynaptic membrane, transforming an ion signal into an electronic signal.

15. The floating memristor of claim 14 wherein the nanowires in the first layer are approximately perpendicular, in orientation, to the nanowires in the second layer.

16. A floating memristor, comprising:
a top electrode;
a bottom electrode; and
a stacked memory assembly interposed between the top electrode and the bottom electrode, wherein the stacked memory assembly includes a top floating gate assembly, an ionic battery, and a bottom floating gate assembly;
wherein the top floating gate assembly and bottom floating gate floating gate assembly each consists of a floating gate barrier layer near the ionic battery, a floating gate tunneling layer near the top or bottom floating gate electrode, and a floating gate electrode between the barrier layer and tunneling layer;
wherein the ionic battery is composed of an ionic battery cathode, an ionic battery anode, and an ionic battery electrolyte, solid or liquid;
an electronic signal can be converted into an ionic signal between the interface of the top floating gate barrier layer and the ionic battery, and the ionic signal can be converted into the electronic signal between the interface of the ionic battery and the bottom floating gate barrier layer.

* * * * *